United States Patent [19]

Bean et al.

[11] Patent Number: 4,514,748
[45] Date of Patent: Apr. 30, 1985

[54] GERMANIUM P-I-N PHOTODETECTOR ON SILICON SUBSTRATE

[75] Inventors: John C. Bean, New Providence; Alexander Kastalsky, North Plainfield; Sergey Luryi, Millington, all of N.J.

[73] Assignee: AT&T Bell Laboratories, Murray Hill, N.J.

[21] Appl. No.: 554,061

[22] Filed: Nov. 21, 1983

[51] Int. Cl.³ .............................................. H01L 29/12
[52] U.S. Cl. ........................................ 357/58; 357/30; 357/90; 357/40
[58] Field of Search ................. 357/30, 30 B, 30 F, 357/30 J, 58, 90, 40

[56] References Cited

U.S. PATENT DOCUMENTS

| | | | |
|---|---|---|---|
| 3,781,612 | 12/1973 | Llacer et al. | 357/58 X |
| 4,166,218 | 8/1979 | Protic et al. | 357/58 X |
| 4,183,034 | 1/1980 | Burke et al. | 357/58 X |
| 4,370,510 | 1/1983 | Stirn | 357/30 X |
| 4,415,916 | 11/1983 | Protic et al. | 357/58 X |

OTHER PUBLICATIONS

Anderson, "Semiconductor Device", *IBM Technical Disclosure Bulletin*, vol. 3, No. 2, Jul. 1960, p. 44.

Primary Examiner—Andrew J. James
Assistant Examiner—William A. Mintel
Attorney, Agent, or Firm—Bruce S. Schneider

[57] ABSTRACT

Devices useful, for example, as detectors in telecommunications systems have been formed utilizing a specific structure. In particular, a p-i-n device is fabricated on a silicon substrate having the necessary circuitry for signal processing. This p-i-n device is produced by depositing an intermediary region having a compositional gradient on this substrate and forming a germanium based p-i-n diode on the intermediary region.

6 Claims, 3 Drawing Figures

GERMANIUM P-I-N PHOTODETECTOR ON SILICON SUBSTRATE

BACKGROUND OF THE INVENTION

1. Field of the Invention

This invention relates to photodetectors and in particular, photodetectors involving Group IV elements.

2. Art Background

Telecommunications systems include a light source such as a laser, a light guiding element such as an optical fiber, and a detector. (For purposes of this disclosure, a detector includes not only a photonic component that produces a signal in response to incident electromagnetic radiation, but also circuitry utilized in processing the resulting signal.) Significant research has been directed to finding a detector that allows the processing of signals at relatively high bit rates, e.g., bit rates greater than 100 Mbit/second, and at nominal cost. One well-investigated approach has involved germanium based photonic devices. For example, germanium p-i-n diodes—diodes having successive regions of p-type germanium, intrinsic material, and n-type germanium—constructed on a germanium substrate have been produced with electrical characteristics allowing light-stimulated signal production at bit rates of 100 Mbit/second and higher. (For purpose of this disclosure, intrinsic material is material, whether doped or not, that has a free majority carrier concentration of $5 \times 10^{15}$ cm$^{-3}$ or less.) Nevertheless, the cost of providing an interface between these germanium devices formed on a germanium substrate with suitable signal processing components (generally formed on a silicon substrate) has made the combination, i.e., the desired detector, economically unacceptable.

Germanium diodes have been formed on silicon substrates by, for example, depositing germanium of one carrier type on a silicon substrate of opposite carrier type. The result of this fabrication process has been totally discouraging. As described by K. Ito and K. Takahashi, *Japanese Journal of Applied Physics*, 7(8), page 821 (1968), germanium diodes formed by depositing germanium on a silicon substrate had a crystal dislocation average spacing of 90 Angstroms. (The average dislocation spacing is the average of the distances from a specific point on each crystal dislocation propagating entirely across the diode active region to a specific point on its nearest neighbor dislocation that also propagates across the active region. These points are defined by the intersection of such dislocations with an imaginary surface defined by the midpoints between the p-i interface and the i-n interface measured in a direction along a normal to the p-i interface.) This level of dislocation spacing in the active area of the diode leads to a very high rate of trapping for photogenerated carriers and results in a quantum efficiency that is intolerably low, e.g., well below 10 percent, and thus totally unacceptable for applications such as optical communication. Thus, substantial additional work concerning germanium based photonic components in a silicon environment has not materialized, possibly due to the apparent hopeless situation presented by initial investigations.

As an alternative to germanium based devices, photonic components based on III-V semiconductor materials have been developed. These components have excellent device characteristics. Although the interface cost for interconnection with suitable silicon based circuitry is still present, the quality of the device itself has, it appears, justified the concomitant expense. Nevertheless, for many applications, such as the high speed data links utilized with optical communication systems, it is still quite desirable to produce a detector that is more economic, even though less sensitive, than a III-V based photonic component with its associated silicon circuitry.

SUMMARY OF THE INVENTION

A particular device configuration involving photonic component integration in a silicon environment, i.e., on a silicon substrate, has resulted in a nominal cost detector with acceptable sensitivity. This configuration involves the formation of an intermediary silicon/germanium composition overlying a silicon substrate with a germanium based p-i-n component overlying the intermediary region. Befoe formation of the intermediary region and the p-i-n component, the silicon substrate is processed so that circuitry useful in processing signals from a photonic device is formed. The intermediary region and germanium based p-i-n diode are then formed on this substrate. The composition of the intermediary region is carefully controlled so that the average dislocation spacing through the intrinsic region of the p-i-n diode, i.e., through the active region, is greater than 1000 Angstroms. (To measure this spacing, dislocations that traverse the active region are those that extend from the p-type region to the n-type region of the device.) Surprisingly, although this defect density level is still quite high (about one-hundredth the density levels attained with prior totally unacceptable devices), no such degradation occurs. Since the detector is formed on a silicon substrate, the economic advantage of integration is achieved. This achievement, together with the benefit of suitable photonic component characteristics, provides a unique device for a multitude of light processing applications, e.g., optical communication applications.

DETAILED DESCRIPTION

Figure 1:
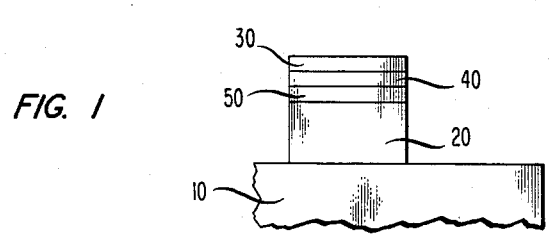
FIG. 1 is illustrative of the inventive detectors.

The inventive detectors are produced by forming a photonic component, i.e., a germanium based p-i-n diode on an intermediary layer. The intermediary layer, 20 in the Figure, is in turn formed on a silicon substrate, 10, that is being processed to contain circuitry suitable for processing signals from a photonic component. The circuitry in the silicon substrate need not be totally completed upon intermediary region and diode fabrication. However, before forming the intermediary region and germanium based diode, all substrate processing steps requiring a temperature greater than 600 degrees C. should be completed. At processing temperatures greater than 600 degrees C., germanium tends to roughen and/or diffuse, and thus germanium containing regions would be substantially degraded by such procedures. Conversely, portions of the silicon substrate, e.g., aluminum metallization layers, that would be substantially affected by the temperatures employed in the production of the photonic component should not be fabricated until this production is accomplished. Since the intermediary and the germanium based p-i-n diode are producible by relatively low temperature processes such as molecular beam epitaxy (MBE), this restraint is not particularly significant.

Generally, steps including dopant diffusion, oxide formation, buried layer formation, polysilicon deposition, and dopant activation are performed before the intermediary region and p-i-n device fabrication, and steps such as metallization, sintering, and/or chemical vapor oxide deposition are performed after this fabrication. The steps employed in silicon substrate processing, such as dopant diffusion, metallization, oxide formation, polysilicon depositing, sintering, buried layer formation, and passivation, are well known and are described in a variety of sources such as *The Physics of Semiconductor Devices*, S. M. Sze, John Wiley and Sons, New York (1981), and *VLSI Technology*, edited by S. M. Sze, McGraw-Hill, New York (1983).

The intermediary region, 20 in the Figure, should have a compositional gradient that provides a transition between the silicon substrate, i.e., a composition that is essentially silicon, and a region of this photonic component, a composition that is at least 50 mole percent germanium and preferably at least 90 percent for light sources employed in longer distance optical communications. (The intermediary region begins when measuring in a direction from the substrate to the diode where the composition reaches at least 1 mole percent germanium and terminates where a region reaches the germanium content of the diode intrinsic region and does not further vary from this level. The addition of silicon enlarges the bandgap of the active region and allows more efficient operation with a short wavelength incident light.) The intermediary region should have a spatial compositional profile that limits the average dislocation spacing through the subsequently formed intrinsic active region of the p-i-n device to a level greater than or equal to 1000 Angstroms. A variety of techniques is available for achieving this dislocation spacing. For example, an essentially linear change in composition over an 1800 Angstrom thick region limits dislocations to the desired level. Alternatively, profiles such as those descried by J. W. Mathews and A. E. Blakeslee, *Journal of Crystal Growth*, 32, page 265 (1976), involving a series of sharp compositional changes from the substrate, or essentially pure silicon region grown on the substrate, to a region including a germanium-silicon alloy and back cause a deflection of dislocation propagation and thus also limit the dislocations penetrating the device active region. A variety of other techniques is employable, and a controlled sample is utilized to determine if a specific spatial compositional configuration satisfies the dislocation criterion.

The intermediary region, in addition to limiting dislocations, also acts as a current conducting region for propagation of the signal produced in the photonic component to the circuitry in the silicon substrate. As such, the intermediary region should have a majority carrier concentration of at least $10^{18}$ cm$^{-2}$. At majority carrier concentration levels less than $10^{18}$ cm$^{-2}$, there is a tendency for heterojunction spikes due to band discontinuities to block carrier flow, while majority carrier concentration levels greater than $10^{20}$ cm$^{-2}$ lead to dislocation formation and are typically inconvenient to produce. The majority carrier is chosen to match the majority carrier type of the portion of the substrate upon which the intermediary region is formed.

Various techniques are available for producing the intermediary region and the germanium based p-i-n diode. However, it has been found that desirable results are achieved through the utilization of a molecular beam epitaxy procedure. This procedure is accomplished at relatively low temperatures, i.e., temperatures below 600 degrees C., and thus allows the formation of a significant portion of the circuitry in the silicon substrate before formation of the intermediary region. Additionally, through the use of molecular beam epitaxy, excellent control is maintained over the composition of the intermediary region. The procedures generally used in molecular beam epitaxy (MBE) are extensively disclosed in review articles such as "Growth of Doped Silicon Layers by Molecular Beam Epitaxy," appearing in *Impurity Doping Processes in Silicon*, edited by F. F. Y. Wang, North Holland, Amsterdam/New York (1981).

Although molecular beam epitaxy techniques are well known, a description is included for completeness. Basically, effusion sources including the materials to be deposited, e.g., germanium and silicon, are utilized to produce the desired deposition. It is advantageous that the deposition of the intermediary region be accomplished on a region of the substrate which is substantially free of impurities. In this regard, before beginning the intermediary region deposition, it is desirable to remove grease and to scavenge metal from the substrate surface. This is accomplished by conventional techniques such as treatment with solvents. A protective oxide is then formed on the surface by, for example, use of a hot phosphoric acid/water/hydrogen peroxide bath. (During the initial processing of the silicon substrate, a region of 100 Angstroms in thickness at the surface is left for this oxide formation.) Deposition is initiated after the substrate is inserted in the molecular beam epitaxy apparatus, the oxide is removed by conventional procedures such as inert gas sputtering, and the substrate is annealed.

Production of the desired majority carrier concentration in a particular region is accomplished by conventional techniques such as dopant coevaporation with the layer being deposited, or dopant incorporation in the layer being deposited, through simultaneous low energy ion implantation of a suitable entity, e.g., $As_2^+$ for an n-type majority carrier and $BF_2^+$ for a p-type majority carrier. (See G. E. Becker and J. C. Bean, *Journal of Applied Physics*, 48, page 3395 (1977), and Y. Ota, *Journal of the Electrochemical Society*, 126, page 1761 (1979) for a description of dopant evaporation and low energy implantation techniques, respectively.)

The photonic component of the inventive detectors should include a germanium based p-i-n diode. If the intermediary region is produced on an n-type region of the substrate, then it should have electrons as the majority carrier, and similarly the photonic component region that in turn contacts it should have electrons as the majority carrier, i.e., should be n-type. Conversely, if the intermediary region is formed on a p-type area of the substrate, then it should have a p-type majority carrier, and the region of the photonic component contacting it should also be p-type. The majority dopant concentration of the p- or n-region of the device which is between the intermediary region, 20, and the intrinsic region, 40, should be sufficient so that it is not completely depleted during the operation of the device. Typically, this criterion is satisfied if, for a specific region, the product of the dopant concentration and region thickness (measured perpendicular to the major surface of the substrate) is at least $10^{13}$ charges/cm$^2$. For lower applied operating voltage levels (levels lower than 1 volt), the criterion of $10^{13}$ charges/cm$^2$ is too stringent, and a smaller dopant concentration/thickness product is not precluded. However, the utilization of p- and n-type regions that satisfy the product criterion is sufficient to avoid undesirable depletion of the p- or n-type area during operation. The dopant concentration of the p- or n-region, 30, on the far side of the intrinsic region, 40, from the intermediary region, 20, should be sufficiently high so that electrical contact made to it by, for example, metallization, produces a resistance which is sufficiently low so that it does not limit detector performance. Typically, dopant concentrations of $10^{18}$ cm$^{-3}$ and higher result in resistances that in fact do not present limitations to performance.

The intrinsic region, i.e., the region of the device having a majority carrier concentration of less than $5 \times 10^{15}$ cm$^{-3}$, should preferably have a thickness of at least 1 $\mu$m. For intrinsic region thicknesses less than 1 $\mu$m, generally the absorption efficiency for incident light is insufficient to produce a signal that is adequate for reliable detection. (Although intrinsic region thicknesses greater than 2 $\mu$m are not precluded, they tend to be uneconomic and lead to somewhat degraded response times.) Additionally, the lower the carrier concentration in the intrinsic region, generally the smaller the component capacitance and the higher the operating speed associated with the detector. Typically, desirable intrinsic region carrier concentrations are those below $5 \times 10^{15}$ carriers/cm$^3$. Generally, to limit noise, the photonic component is operated at reverse voltages in the range from 1.0 volt to 5.0 volts for carrier concentrations in the range $2 \times 10^{14}$ cm$^{-3}$ to $5 \times 10^{15}$ cm$^{-3}$, while the photonic component is advantageously operable at a voltage below 1 volt when the carrier concentration level is reduced to below $2 \times 10^{14}$ cm$^{-3}$.

Generally, the intrinsic region is advantageously produced by techniques such as molecular beam epitaxy. The intrinsic region need not be composed entirely of germanium. An alloy of up to 50 mole percent of silicon in germanium is also useful. The purity of the germanium (and silicon if desired) introduced into the effusion source(s) in turn (generally for uncompensated regions) determine the lowest level of carrier concentration density attainable in the intrinsic region. Generally, germanium (and silicon) having a purity of $10^{16}$ cm$^{-3}$ yield a carrier concentration of $10^{15}$ cm$^{-3}$, while germanium having a purity of $10^{15}$ cm$^{-3}$ yields a carrier concentration of $10^{14}$ cm$^{-3}$.

In one embodiment, after the intermediary region is formed, the regions of the germanium based p-i-n diode are sequentially produced again through the use of molecular beam epitaxy. The composition of the p-type and n-type regions should preferably be essentially the same as that of the i region. After the fabrication of the intermediary region and germanium based diode, the silicon substrate processing is completed. In this way, an advantageous detector for a variety of applications, such as optical communication data links, is produced. The following Example is illustrative of procedures suitable for producing the inventive detectors.

EXAMPLE 1

A silicon substrate measuring 3 inches in diameter and having its major surface in the (100) plane was utilized. This substrate was selected so that it had a bulk dislocation density of approximately 100/cm$^2$ or less, and so that this dislocation density did not increase at the surface of the substrate. The substrate was n-type doped with phosphorus and had a resistivity of approximately 1 ohm-cm. The surfaces of the substrate were oxidized by conventional techniques. One major surface of the substrate (referred to as the front surface) was protected with a standard photoresist, and the oxide on the opposite major surface (referred to as the back surface) was removed by chemical etching. The resist from the front surface was then removed with a suitable solvent. The substrate was cleaned by immersing it for a short period of time in a mixture of phosphoric acid, water, and hydrogen peroxide. The substrate was then placed in an oven containing a phosphorus atmosphere and heated to an elevated temperature. This treatment was continued for a sufficient time to induce some diffusion of the phosphorus into the unprotected region of the substrate to allow subsequent metal contact formation.

The substrate was removed from the oven, the remaining oxide removed by chemical etching, and the substrate cleaned with solvents. The substrate was then again immersed in the phosphoric acid/water/hydrogen peroxide solution. (The phosphoric acid in the solution produced a very thin film of oxide.) Within a few hours of the second phosphoric acid treatment, the substrate was inserted on the sample holder of a molecular beam epitaxy apparatus. This apparatus included two independently controllable electron beam sources and an ion implantation source capable of implanting at energies less than 5 kilo electron volts. The density of evaporation species from each source was monitored in the proximity of the substrate utilizing a commercially available electron induced photoemission monitor. The flux of ions from the ion implantation source was monitored utilizing a Faraday cup. The signals from these sensors were employed in a feedback loop to maintain the flux of each entity at a desired level with variations of less than 3 percent. The apparatus was evacuated to a pressure of approximately $2 \times 10^{-10}$ Torr. (The electron beam sources and the ion implantation sources were energized before insertion of the substrate and any out-gassed products effectively removed.) The resulting background pressure during operation was approximately 5 to $50 \times 10^{-9}$ Torr. The predominant contributors to this background pressure were hydrogen and helium.

Any residual oxide or contaminants remaining on the front surface of the substrate were removed by subjecting this surface to an argon ion flux of approximately 100 microamps/cm$^2$ incident on the substrate at an angle of approximately 60 degrees to the normal and having an average energy of 1 keV. This treatment was continued for approximately 90 seconds and the ion source was then extinguished. The temperature of the substrate was relatively rapidly increased to 500 degrees C., and then was increased from 500 degrees C. to 800 degrees C. over a period of approximately 2 to 3 minutes. A temperature of 800 degrees C. was then maintained for an additional 10 minutes. (This temperature treatment was performed to expel any residual argon and to heal any defects introduced by the sputter cleaning.) The temperature was then reduced to approximately 750 degrees C. over a period of approximately 1 minute. The shutter for the silicon evaporation source was opened to induce silicon growth, and at approximately the same time, ion implantation of arsenic in the form of As$_2^+$ was initiated. The ion implantation was controlled so that the resulting deposited silicon layer had a majority carrier concentration of approximately $10^{18}/cm^3$. The silicon flux was controlled to yield a growth rate of approximately 2 Angstroms/second, and the deposit was continued to produce a total layer thickness of approximately 1000 Angstroms. As the silicon layer reached a thickness of 900 Angstroms, the temperature of the substrate was reduced so that it reached a temperature of approximately 550 degrees C. when the total thickness of 1000 Angstroms had been attained. At this point, the shutter of the germanium source was opened, and the flux of the germanium source relative to the silicon source was adjusted so that the composition of the deposited layer was 90 percent silicon and 10 percent germanium. This growth was continued until a layer of 200 Angstroms was formed. The flux rates were then again adjusted to produce a layer of 80 percent silicon and 20 percent germanium, and again this growth was continued for 200 Angstroms. Subsequently, in deposition steps of 200 Angstroms each, the germanium content was increased an additional 10 percent for each step. In this way, by the deposition of 9 layers, a composition of 100 percent germanium was reached. (Through the entire deposition, the total layer formation rate was maintained at 2 Angstroms/second.) The silicon source was then again shuttered, and a 3000 Angstrom thick region of germanium was deposited.

The arsenic implantation was then terminated, and the germanium growth rate was increased to 5 Angstroms/second. This deposition of undoped germanium was continued to yield a total undoped germanium region of approximately 2 μm. The germanium deposition rate was then reduced to 2 Angstroms/second, and ion implantation of $BF_2^+$ was initiated. The ion implantation source was controlled to produce a dopant concentration of approximately $1 \times 10^{18}$ cm$^{-3}$. The growth was continued to produce a p-type region of approximately 2500 Angstroms in thickness. Growth was then terminated. The substrate was removed from the molecular beam epitaxy apparatus.

Figure 2:
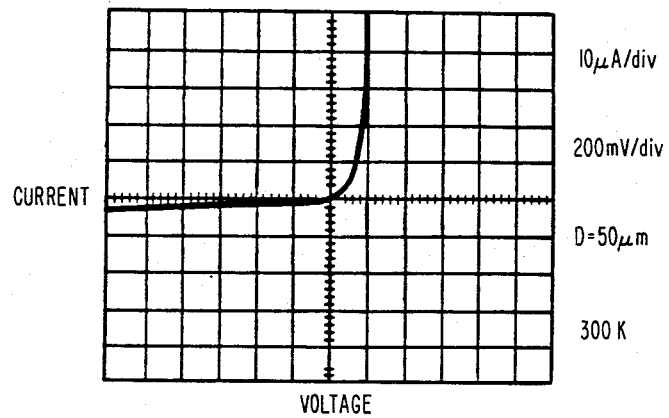
FIGS. 2 and 3 are illustrative of obtainable electrical characteristics.
Figure 3:
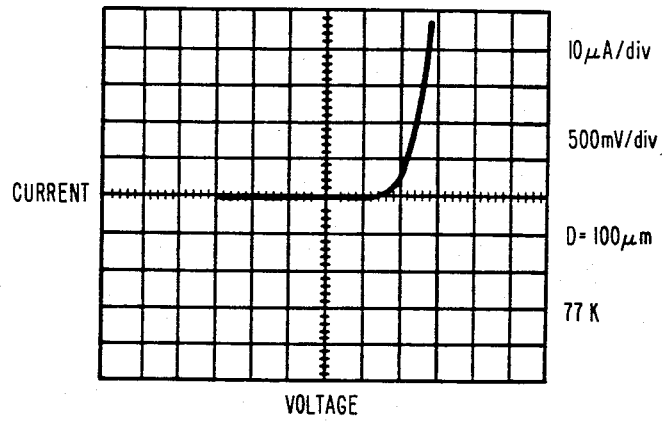

A conventional aluminum back contact and a conventional titanium/gold front contact were formed, and the substrate was processed into individual diodes. Either the front or back contact was patterned to produce a window so that incident light could reach the intrinsic region. Also, etching of the germanium was performed so that the diode was mesa isolated. The diode was illuminated utilizing a tungsten light source that was calibrated using a commercially available germanium detector. The resulting external quantum efficiency of the diode was measured to be approximately 41 percent. This efficiency matched the efficiency of the state-of-the-art germanium detector and was approximately the same both at room temperature and at 77 degrees Kelvin. The I-V curves taken at both 300 degrees Kelvin and 77 degrees Kelvin are shown in FIGS. 2 and 3. (The diameter, D, of the circular contact that was employed for the measurement is indicated in the Figures.)

EXAMPLE 2

The procedure of Example 1 was followed, except the n-type germanium region was increased from 3000 Angstroms to 1.25 μm in thickness. The resulting electrical characteristics were approximately the same as those described in Example 1.

What is claimed is:

1. A device comprising (1) a substrate comprising silicon that includes semiconductor devices and (2) a photonic component that produces a current when stimulated by electromagnetic radiation characterized in that said photonic component comprises a germanium based p-i-n diode, including an intrinsic portion, a p-type portion, and an n-type portion, that is electrically and physically connected to said substrate by an intermediary region, said intermediary region limiting the average spacing of the crystal dislocations propagating through said intrinsic portion to greater than 1000 Angstroms.

2. The device of claim 1 wherein said intermediary region comprises a compositional graded material comprising germanium and silicon.

3. The device of claim 2 wherein said grading varies from a region consisting essentially of silicon contacting said substrate to a region consisting essentially of germanium contacting said p-i-n diode.

4. The device of claim 2 wherein said intermediary region and said p-i-n diode are formed by molecular beam epitaxy.

5. The device of claim 1 wherein said intermediary region and said p-i-n diode are formed by molecular beam epitaxy.

6. The device of claim 1 wherein the free carrier concentration in said intermediary region is greater than $10^{18}$ cm$^{-3}$.

* * * * *